United States Patent [19]

Miyazaki et al.

[11] Patent Number: 5,644,381

[45] Date of Patent: Jul. 1, 1997

[54] METHOD OF EXPOSURE EMPLOYING PHASE SHIFT MASK OF ATTENUATION TYPE

[75] Inventors: Junji Miyazaki; Nobuyuki Yoshioka, both of Hyogo, Japan

[73] Assignee: Mitsubishi Denki Kabushiki Kaisha, Tokyo, Japan

[21] Appl. No.: 440,611

[22] Filed: May 15, 1995

[30] Foreign Application Priority Data

Jul. 11, 1994 [JP] Japan .................... 6-158419

[51] Int. Cl.$^6$ .................... G03B 27/42; G03B 27/32; G03B 27/72
[52] U.S. Cl. .................... 355/53; 355/71; 355/77
[58] Field of Search .................... 355/53, 71, 77; H01L 21/27; G03F 1/00, 1/08, 1/14

[56] References Cited

U.S. PATENT DOCUMENTS

| 4,231,657 | 11/1980 | Iwamatsu | 355/71 |
| 4,355,892 | 10/1982 | Mayer et al. | 355/77 |
| 5,328,784 | 7/1994 | Fukuda | 430/5 |
| 5,393,623 | 2/1995 | Kamon | 430/5 |
| 5,411,824 | 5/1995 | Vasudev et al. | 430/5 |
| 5,428,478 | 6/1995 | Hanyu et al. | 359/565 |

FOREIGN PATENT DOCUMENTS

| 57-62052 | 4/1982 | Japan . |
| 58-173744 | 10/1983 | Japan . |
| 1-147458 | 6/1989 | Japan . |
| 4-136854 | 5/1992 | Japan . |

OTHER PUBLICATIONS

"Imaging Characteristics Of Multi–Phase–Shifting And Halftone Phase–Shifting Masks", Terasawa et al., JJAP Series 5, pp. 3–9.

"Systematic Design Of Phase–Shifting Masks With Extended Depth Of Focus And/Or Shifted Focus Plane", Liu et al., SPIE vol. 1674, pp. 14–16, 18–52.

*Primary Examiner*—Arthur T. Grimley
*Assistant Examiner*—Herbert V. Kerner
*Attorney, Agent, or Firm*—Lowe, Price, LeBlanc & Becker

[57] ABSTRACT

By the method of exposure using attenuation type phase shift mask, based on the phase angle of exposure light passing through second and third light transmitting portions and on hole diameters of the second and third light transmitting portions, an optimal value between first and second distances $h_1$ and $h_2$ can be calculated. Therefore, a resist film can be exposed at optimal focal position. As a result, even when there is a step in the material to be exposed, a desired pattern can be exposed with high precision through the same steps in every region of the material to be exposed.

3 Claims, 8 Drawing Sheets

FIG.3
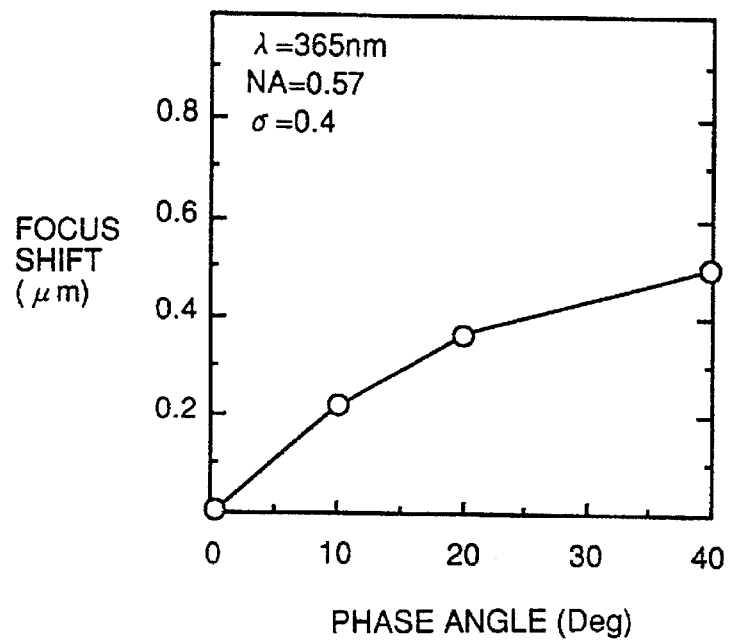
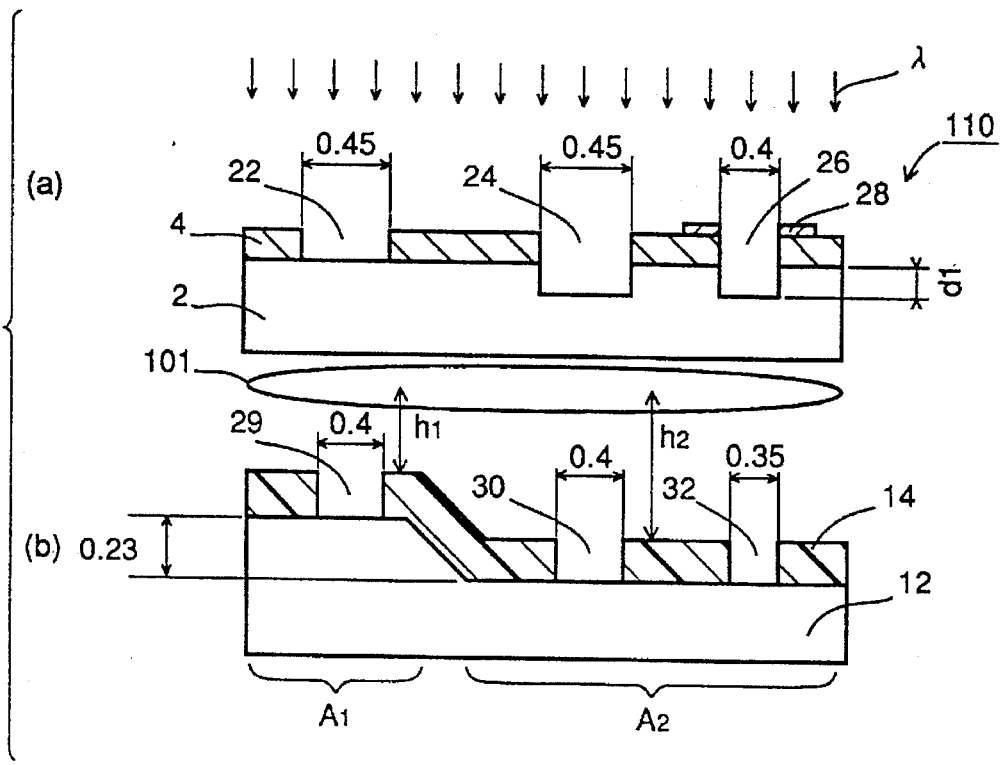
FIG.4

METHOD OF EXPOSURE EMPLOYING PHASE SHIFT MASK OF ATTENUATION TYPE

BACKGROUND OF THE INVENTION

1. Field of the Invention

The present invention relates to a method of exposure employing phase shift mask of attenuation type and, more particularly, to a method of exposure for exposing a material having a stepped portion.

2. Description of the Background Art

Recently, semiconductor integrated circuits have been remarkably improved in the degree of integration and miniaturization. Accordingly, circuit patterns formed on the semiconductor substrate has been rapidly reduced in size. Photolithography is widely recognized as basic technique in patterning. Though various developments and improvements have been made to date, there is stronger demand in improved resolution of patterns, as patterns have come to be smaller and smaller.

The resolution limit R (nm) in photolithography employing the magnification exposure method is represented as $$R = K_1 \cdot \lambda/(NA) \tag{1}$$

where $\lambda$ represents wavelength (nm) of the light beam used, NA represents numerical aperture of the lens, and $K_1$ is a constant dependent on the resist process.

As can be seen from equation (1), in order to improve resolution limit, the values of $K_1$ and $\lambda$ should be reduced while the value of NA should be increased. In other words, the constant dependent on the resist process should be made smaller while the wavelength of the light beam should be reduced and the numerical aperture should be enlarged. However, improvement in the light source and the lens is technically difficult and, in addition, if the wavelength is made shorter and NA is increased, depth of focus $\delta$ ($\delta = K_2 \cdot \lambda/(NA)^2$) becomes shallower, resulting in undesirable lowering of the resolution.

Referring to FIGS. 11(a), (b) and (c), cross section of a photomask, electric field of the exposure light on the photomask and intensity of the exposure light on the semiconductor wafer will be described.

First, referring to FIG. 11(a), cross sectional structure of a photomask 100 will be described. On a quartz glass substrate 110, a metal mask pattern 120 formed of chromium or the like and a light transmitting pattern 130 exposing the quartz glass substrate 110 are formed. Referring to FIG. 11(b), the electric field of the exposure light immediately after the passage through photomask 100 will be described. The electric field of the exposure light on photomask 100 is conforming to the photomask pattern. Referring to FIG. 11(c), light intensity on the semiconductor wafer will be described. As to the intensity of exposure light on the semiconductor wafer, especially when fine pattern is to be transferred, the beams of exposure light which have passed through the photomask are overlapped at adjacent pattern images because of diffraction and interference of light as shown in the figure, and thus the intensity is increased. As a result, the difference in the intensity of light on the semiconductor wafer becomes smaller, resulting in poor resolution.

In order to solve this problem, Japanese Patent Laying-Open No. 57-62052 and 58-173744 proposed a phase shift exposure method employing a phase shift mask. Referring to (a), (b) and (c) of FIG. 12, the phase shift exposure method using a phase shift mask disclosed in Japanese Patent Laying-Open No. 58-173744 will be described. Referring to FIG. 12(a), the cross sectional structure of phase shift mask 200 will be described. The phase shift mask 200 includes a chromium mask pattern 220 formed on a glass substrate 210, and a light transmitting portion 230 at which glass substrate 210 is exposed. Further, at every other light transmitting portions 230, a phase shift 240 formed of a transparent insulating film such as a silicon oxide film, is provided.

Referring to FIG. 12(b), the electric field of the exposure light on the phase shift mask will be described. The electric field of the exposure light on the phase shift mask provided by the exposure light which has passed through the phase shift mask 200 has its phase inverted by 180° alternately. Therefore, the light beam offset with each other at adjacent pattern images where exposure light beams overlap with each other, because of light interference. The intensity of exposure light on the semiconductor wafer will be described with reference to FIG. 12(c). As shown in the figure, the difference in intensity of exposure light on the semiconductor wafer is distinctive, and thus resolution of the pattern image can be improved.

The phase shift exposure method employing the phase shift mask is very effective for periodic patterns having lines and spaces, for example. However, if the pattern is complicated, positioning of the phase shift is very troublesome, and therefore this method cannot be applied to every desired pattern.

As a phase shift mask solving this problem, an attenuation type phase shift mask is disclosed, for example, in JJAP Series 5 *Proc. of 1991 Intern. Micro Process Conference* pp. 3–9 and in Japanese Patent Laying-Open No. 4-136854. The phase shift mask of attenuation type disclosed in Japanese Patent Laying-Open No. 136854 will be described in the following.

Referring to FIG. 13(a), the structure of the attenuation type phase shift mask 300 will be described. The attenuation type phase shift mask 300 includes a phase shift pattern, which is a prescribed exposure pattern, that includes a quartz substrate 310 transmitting exposure light, light transmitting portions 330 formed on the main surface of the quartz substrate 310 and exposing the main surface of the quartz substrate 310, and a phase shift film 320 for shifting the phase of the exposure light passing therethrough by 180° with respect to the phase of the exposure light passing through said transmitting portions 330. The phase shift film 320 has a two-layered structure consisting of a chromium layer 320a having the light transmittance of 5 to 20%, and a shift layer 320b providing phase difference of 180° between the light passing therethrough and the light passing through the light transmitting portions 330. Recently, chromium oxide, chromium nitride oxide, chromium nitride carbide oxide, molybdenum silicide oxide, and molybdenum silicide nitride oxide have come to be used as a one layered structure phase shift portion, instead of the aforementioned phase shifter portion 320.

Provision of the attenuation type phase shift mask allows exposure of even a complicated pattern, and therefore this has become dominant in the recent exposure methods.

However, semiconductor devices have very complicated cross sectional structures these days. Therefore, when a resist film is to be exposed by using the aforementioned attenuation type phase shift mask, there is often a step in the material underlying a resist film. Therefore, optimal focal position may differ from one position to the other, even in one and the same step of exposure.

For example, let us consider an example in which there is a step in an underlying substrate 12, a resist film 14 is formed on the substrate 12 having the step and resist film 14 is to be exposed, with reference to FIGS. 14 to 16.

First, referring to FIG. 14, assume that the focal position is at the left side region of resist film 14. In this case, at the left side region of resist film 14, a desired pattern 14a can be formed. However, in the right side region of resist film 14, a pattern 14b is formed with the diameter being smaller than desired.

Referring to FIG. 15, let us assume that the focal position is in the right side region of resist film 14. In this case, a desired pattern 14b can be formed in the right side region of resist film 14. However, in the left side of resist film 14, a pattern 14a is formed with its diameter made larger than desired.

Referring to FIG. 16, assume that the focal position is at the intermediate portion of the step. In this case, in the left side region of resist film 14, pattern 14a is formed with its diameter being larger than desired, while in the right side region of resist film 14, pattern 14b is formed with its diameter made smaller than desired.

As described above, when there is a step in the resist film, optimal focal position cannot be obtained for every region in one and same step of exposure, and hence desired pattern cannot be formed in the resist film.

SUMMARY OF THE INVENTION

An object of the present invention is to provide a method of exposure employing a phase mask of attenuation type which allows highly precise exposure of desired patterns in every region even when there is a step in the material to be exposed.

According to one aspect, the present invention is directed to a method of exposure using an attenuation type phase shift mask in which, by using an exposure apparatus having an attenuation type phase shift mask including first and second light transmitting portions exposing a transparent substrate and a phase shift mask formed on the aforementioned transparent substrate to surround the first and second light transmitting portions, a material having a first exposure region which is positioned at a first distance from a projection lens of the exposure apparatus corresponding to the region of the first light transmitting portion and a second exposure region positioned at a second distance from the projection lens of the exposure apparatus corresponding to the region of the second light transmitting portion, characterized in that the method includes a step of providing a prescribed phase angle to the exposure light passing through the second light transmitting portion, and the step of calculating optimum value of difference between the first and second distances, based on the aforementioned phase angle and the hole size of the second light transmitting portion.

Accordingly, the first region to be exposed comes to be positioned at the optimal focal position of the exposure light which passed through first light transmitting portion, and the second region to be exposed comes to be positioned at the optimal focal position of the exposure light which has passed through the second light transmitting portion. Therefore, both the first and second regions to be exposed which are at different distances from the projection lens of the exposure apparatus can be exposed at the optimal focal positions in respective regions, and thus a desired pattern can be exposed.

According to another aspect, the present invention relates to a method of exposure using a phase shift mask of attenuation type in which, by using an exposure apparatus including an attenuation type phase shift mask having first and second light transmitting portions exposing a transparent substrate and a phase shift mask formed on the transparent substrate and surrounding the first and second light transmitting portions, a material to be exposed having a first region to be exposed positioned at a first distance from a projection lens of the exposure apparatus corresponding to the region of the first light transmitting portion and a second region to be exposed positioned at a second distance from the projection lens of the exposure apparatus corresponding to the region of the second light transmitting portion is exposed, characterized in that the method includes the steps of providing a prescribed phase angle to the exposure light passing through the second light transmitting portion, and calculating optimal value of difference between the first and second distances based on the phase angle, hole size of the second light transmitting portion and transmittance of the phase shift film near the periphery of the second light transmitting portion, with the transmittance of the phase shift film near the periphery of the second light transmitting portion made different from the transmittance of the phase shift mask near the periphery of the first light transmitting portion.

Accordingly, the first region to be exposed comes to be positioned at the optimal focal position of the exposure light which has passed through the first light transmitting portion, and the second region to be exposed comes to be positioned at the optimal focal position of the exposure light which has passed through the second light transmitting portion. As a result, both the first and second regions to be exposed which are positioned at different distances from the projection lens of the exposure apparatus can be exposed at optimal focal positions respectively, and thus desired patterns can be exposed in respective regions.

According to a still another aspect, the present invention relates to a method of exposure employing a phase shift mask of attenuation type in which by using an exposure apparatus including an attenuation type phase shift mask having a phase shift mask formed on a transparent substrate, a first pattern in which a plurality of first light transmitting portions exposing the transparent substrate are arranged at prescribed positions on the phase shift mask with prescribed pitch between each other and a second pattern in which a plurality of second light transmitting portions exposing the transparent substrate are arranged with a prescribed pitch between each other, a material having a first region to be exposed positioned at first distance from a projection lens of the exposure apparatus corresponding to the region of the first pattern and a second region to be exposed positioned at a second distance from the projection lens of the exposure apparatus corresponding to the region of the second pattern is exposed, characterized in that the method includes the step of providing a prescribed phase angle to the exposure light transmitting through the second light transmitting portion, and calculating optimal value of a difference between the first and second distances based on the phase angle, hole size of the second light transmitting portion and the space between the second light transmitting portions.

Accordingly, the first region to be exposed comes to be positioned at the optimal focal position of the exposure light which has passed through the first pattern, and the second region to be exposed comes to be positioned at the optimal focal position of the exposure light which has passed through the second pattern. As a result, both the first and second regions to be exposed which are positioned at different distances from the projection lens of the exposure apparatus can be exposed at optimal focal positions respectively, and thus desired patterns can be exposed at respective regions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows relation between the phase angle and focus shift.

FIG. 4 shows a second embodiment of the present invention in which (a) is a cross section of an attenuation type phase shift mask and (b) is a cross section of a resist film formed by using the attenuation type phase shift mask of (a).

DESCRIPTION OF THE PREFERRED EMBODIMENTS

A first embodiment of the method of exposure employing an attenuation type phase shift mask in accordance with the present invention will be described with reference to the figures.

Figure 1:
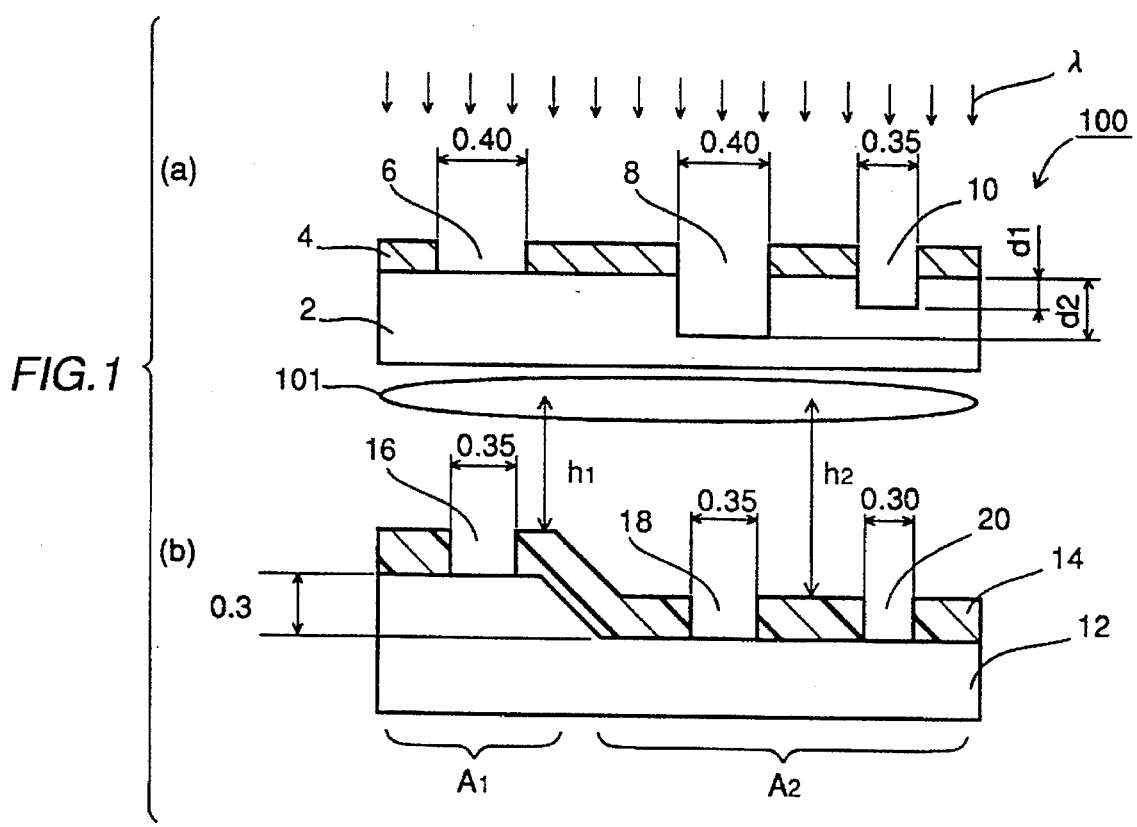
FIG. 1 is an illustration of a first embodiment of the present invention in which (a) is a cross section showing a structure of an attenuation type phase shift mask, and (b) is a cross section of a resist film formed by using the phase shift mask of the attenuation type of (a).

Referring to FIG. 1(a), cross sectional structure of a phase shift mask 100 of attenuation type used in the present embodiment will be described. At prescribed positions of a quartz substrate 2, first and second light transmitting portions 6 and 8 each having hole diameter of 0.40 µm through which quartz substrate 2 is exposed, and a third light transmitting portion 10 having hole diameter of 0.35 µm through which the substrate is exposed are provided, and remaining region is covered with a phase shift film 4. In the present embodiment, a single layer film formed of chromium oxide, chromium nitride oxide, chromium nitride carbide oxide, molybdenum silicide oxide, molybdenum silicide nitride oxide or the like is used as phase shift mask 4, which provides a phase angle of 180° to the exposure light transmitting therethrough, and its has transmittance of 10%.

At the second light transmitting portion 8, the transparent quartz substrate 2 is dug to the depth of $d_2$ so as to provide phase angle of 20° to the exposure light transmitting therethrough, and at the third transmitting portion 10, quartz substrate 2 is dug to the depth of $d_1$ so as to provide phase angle of 10° to the exposure light transmitting therethrough.

Referring to FIG. 1(b), the resist film which is exposed/developed by using the phase shift mask 100 of attenuation type mentioned above will be described. The resist film 14 is formed on a stepped substrate 12, and the step is reflected to the surface of resist film 14. Therefore, the distance between the region $A_1$ on the left side of the resist film 14 to a projection lens 101 is different from the distance between the region $A_2$ on the right side to the projection lens 101 (represented by $h_1$ and $h_2$ in the figure), with the step being the boundary.

At a position corresponding to the first light transmitting portion 6 of resist film 14, a hole 16 having the diameter of 0.35 µm is formed, at a position corresponding to the second light transmitting portion 8 of resist film 14, a hole 18 having the diameter of 0.35 µm is formed, and at a position corresponding to the third light transmitting portion 10 of resist film 14, a hole 20 having the diameter of 0.30 µm is formed. Generally, when a resist film is to be exposed by using an attenuation type phase shift mask and a hole having the diameter of 0.30 µm is to be provided in the resist film, it is known that the hole diameter of the light transmitting portion on the side of the attenuation type phase shift mask should be set to 0.35 µm, that is, larger by 0.05 µm.

Figure 2:
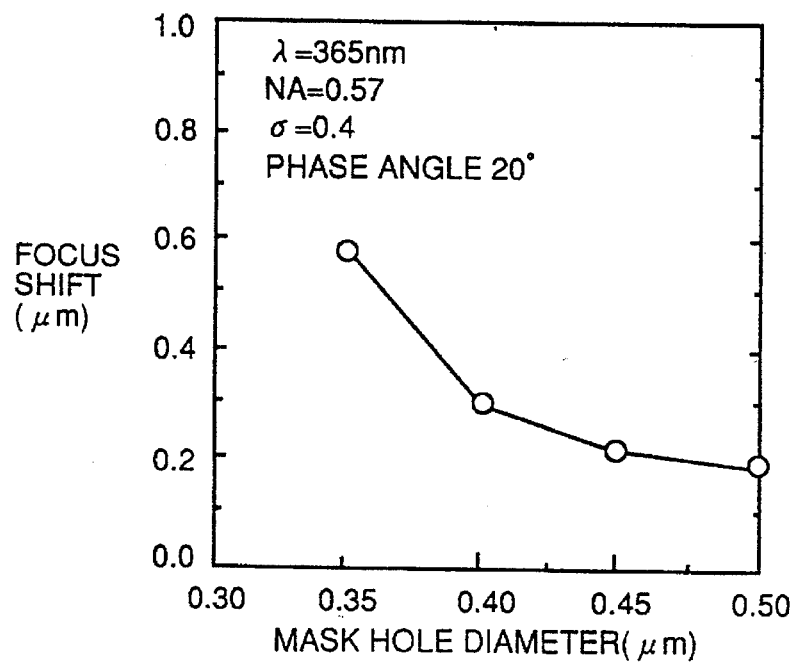
FIG. 2 shows relation between a mask hole diameter and focus shift in accordance with the first embodiment of the present invention.

Referring to FIG. 2, relation between focus shift and the mask hole diameter formed in attenuation type phase shift mask 100 when a prescribed phase angle is provided to the exposure light transmitting through the second and third light transmitting portions 6 and 8 will be described. FIG. 2 shows the relation between the focus shift (µm) and the mask hole diameter (µm) when wavelength ($\lambda$) of the exposure light is 365 nm, numerically aperture (NA) of the exposure apparatus is (NA)=0.57, coherency ($\sigma$) is ($\sigma$)=0.4 and phase angle is 20°.

According to the present invention, it can be understood from the graph of FIG. 2 that focus shift (µm) is 0.3 µm when the mask hole diameter is 0.40 µm. Therefore, referring to FIG. 1, the optimal focal position of region $A_2$ is shifted by 0.3 µm with respect to the optimal focal position of the region $A_1$. As a result, when the step between the regions $A_1$ and $A_2$ is 0.3 µm, it is possible to expose both the regions $A_1$ and $A_2$ simultaneously through the same step of exposure at optimal focal positions, with the mask hole diameter of 0.40 µm.

When mask hole diameter is 0.35 µm, the focus shift (µm) is 0.6 µm, as can be seen from FIG. 2. The relation between the phase angle provided to the exposure light and the focus shift is approximately in direct proportion, so long as the phase angle is within the range of 0° to 20°, as shown in FIG. 3. Therefore, when the phase angle provided to the exposure light transmitting through the third light transmitting portion having the hole diameter of 0.35 μm is set to 10°, the focus shift would be 0.3 μm, and therefore the same result as provided to the exposure light passing through the second light transmitting portion can be obtained.

According to the first embodiment, it becomes possible to determine optimal focal positions corresponding to the step in the substrate, that is, the difference between the distances from region $A_1$ to the projection lens and from region $A_2$ to the projection lens of the exposure apparatus, based on the phase angle of the exposure light passing through the second and third light transmitting portions and on the hole diameters of the second and third light transmitting portions. As a result, even when there is a step in the resist film, exposure can be done at optimal focal positions simultaneously by using the same attenuation type phase shift mask.

The second embodiment of the method of exposure using the attenuation type phase shift mask based on the present invention will be described with reference to the figures. First, referring to FIG. 4(a), cross sectional structure of the attenuation type phase shift mask 110 used in the present embodiment will be described. At prescribed positions of a quartz substrate 2, first and second light transmitting portions 22 and 24 having hole diameter of 0.45 μm through which quartz substrate 2 is exposed, and a third light transmitting portion 26 having hole diameter of 0.4 μm are provided, and remaining region is covered with a phase shift mask 4. Phase shift mask 4 is formed of the same material as in the first embodiment described above, and this film provides a phase difference of 180° to the exposure light transmitting therethrough, and has transmittance of 10%.

At second and third light transmitting portions 24 and 26, transparent quartz substrate 2 is dug to the depth of $d_1$, so as to provide a phase angle of 10° to the exposure light passing therethrough.

A transmittance adjusting film 28 formed of chromium or the like having transmittance of 50% is formed on phase shift film 4 near the periphery of third light transmitting portion 26. Accordingly, substantial transmittance of the region on which transmittance adjustment film 28 is formed is 5%.

The resist film exposed/developed by using the attenuation type phase shift mask 110 will be described with reference to FIG. 4(b). The resist film is formed on a stepped substrate 12, and the step is reflected to the surface of resist film 14. Therefore, the distance from the left region $A_1$ of the resist film 14 to the projection lens 101 differs from the distance from the right region $A_2$ to the projection lens 101 (represented by $h_1$ and $h_2$ in the figure), with the step being the boundary.

At a position corresponding to first light transmitting portion 6 of resist film 14, a hole 29 having hole diameter of 0.4 μm is formed, at a position corresponding to second light transmitting portion 24 of resist film 14, a hole 30 having hole diameter of 0.4 μm is formed, and at a position corresponding to third light transmitting portion 26 of resist film 14, a hole 32 having hole diameter of 0.35 μm is formed.

Figure 5:
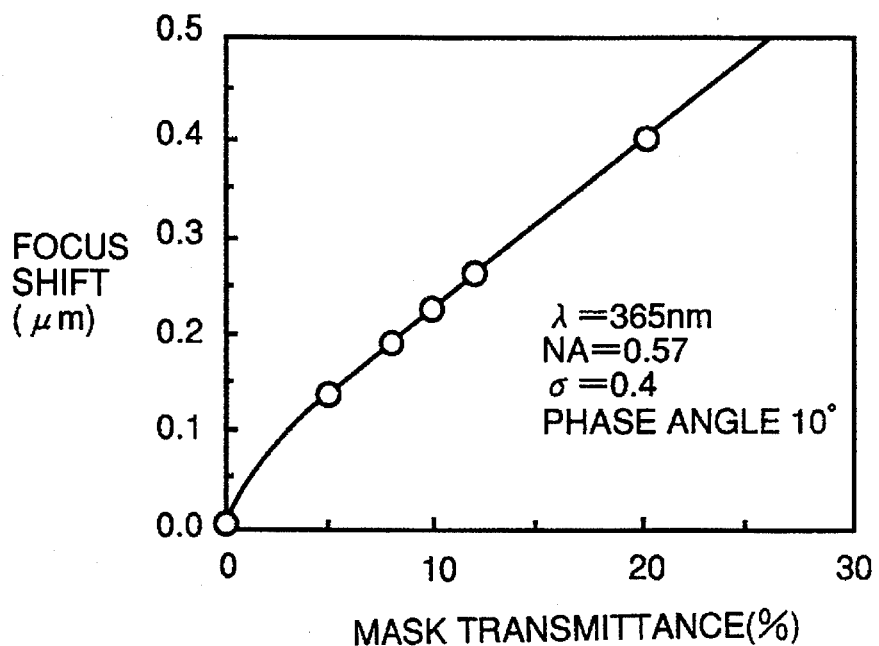
FIG. 5 is a first illustration showing relation between mask transmittance and focus shift in accordance with the second embodiment of the present invention.
Figure 6:
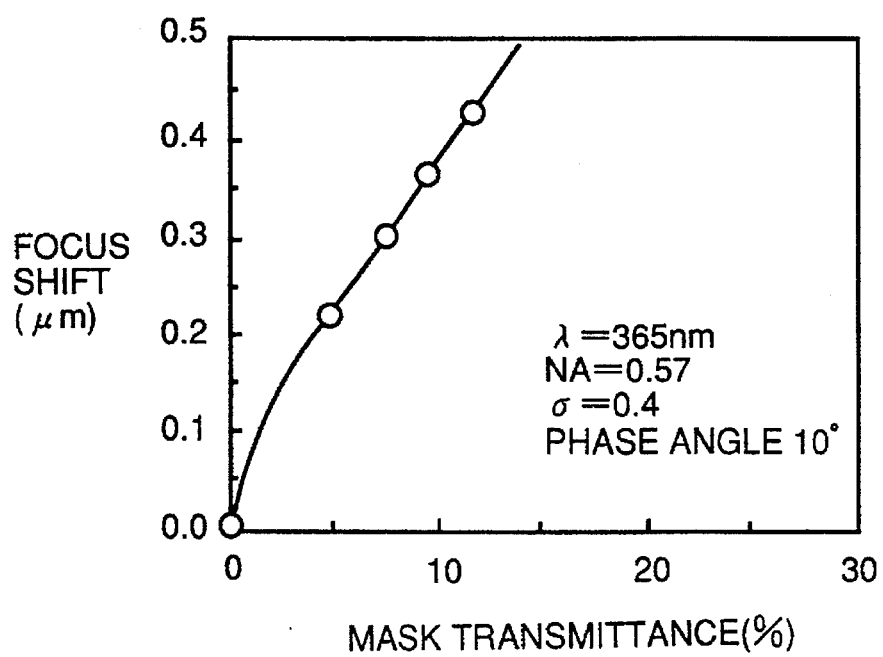
FIG. 6 is a second illustration showing relation between mask transmittance and focus shift in the second embodiment of the present invention.

Referring to FIGS. 5 and 6, relation between transmittance of phase shift film 4 near the periphery of third light transmitting portion 26 and focus shift with certain mask hole diameter formed in the attenuation type phase shift mask 110 and prescribed phase angle (in the present embodiment, 10°) applied to the exposure light transmitting through the second and third light transmitting portions 24 and 26 will be described.

FIG. 5 shows relation between transmittance (%) of the phase shift mask in the periphery of the third light transmitting portion and focus shift (μm) when the mask hold diameter is 0.45 μm, wavelength λ of the exposure light is λ=365 nm, numerical aperture (NA) of the exposure apparatus is (NA)=0.57 and the coherency (σ) of the exposure apparatus is (σ)=0.4. FIG. 6 shows the relation between transmittance (%) of the phase shift mask in the periphery of the third light transmitting portion and focus shift (μm) under the same conditions as in the example of FIG. 5 except that the mask hole diameter is 0.40 μm.

Referring to FIG. 5, when the mask hold diameter is 0.4 μm and the mask transmittance (%) is 10%, the focus shift is 0.23 μm. Therefore, if the step between the regions $A_1$ and $A_2$ is 0.23 μm, both the regions $A_1$ and $A_2$ can be exposed through the same step of exposure simultaneously at optimal focal positions. When the mask hole diameter is 0.4 μm and the same amount of focus shift is to be obtained, the mask transmittance (%) should be about 5%. Therefore, by setting the transmittance near the third light transmitting portion of the attenuation type phase shift mask 110 to 5% as in the present embodiment, every region can be exposed at optimal focal position.

As described above, according to the second embodiment, it becomes possible to expose a stepped resist film at optimal focal positions, based on the phase angle of the exposure light passing through the second and third light transmitting portions, the hole diameters of the second and third light transmitting portions, the hole diameters of the second and third light transmitting portions and the transmittance of the phase shift portion near the periphery of the second and third light transmitting portions. Further, as compared with the first embodiment, by adjusting transmittance of the attenuation type phase shift mask near the periphery of the third light transmitting portion, the depth of trenches dug in the substrate for providing phase angle to the second and third light transmitting portions can be made the same, and therefore manufacturing of the attenuation type shift mask is facilitated.

A third embodiment of the method of exposure employing phase shift mask of attenuation type of the present invention will be described with reference to the figures.

Figure 7:
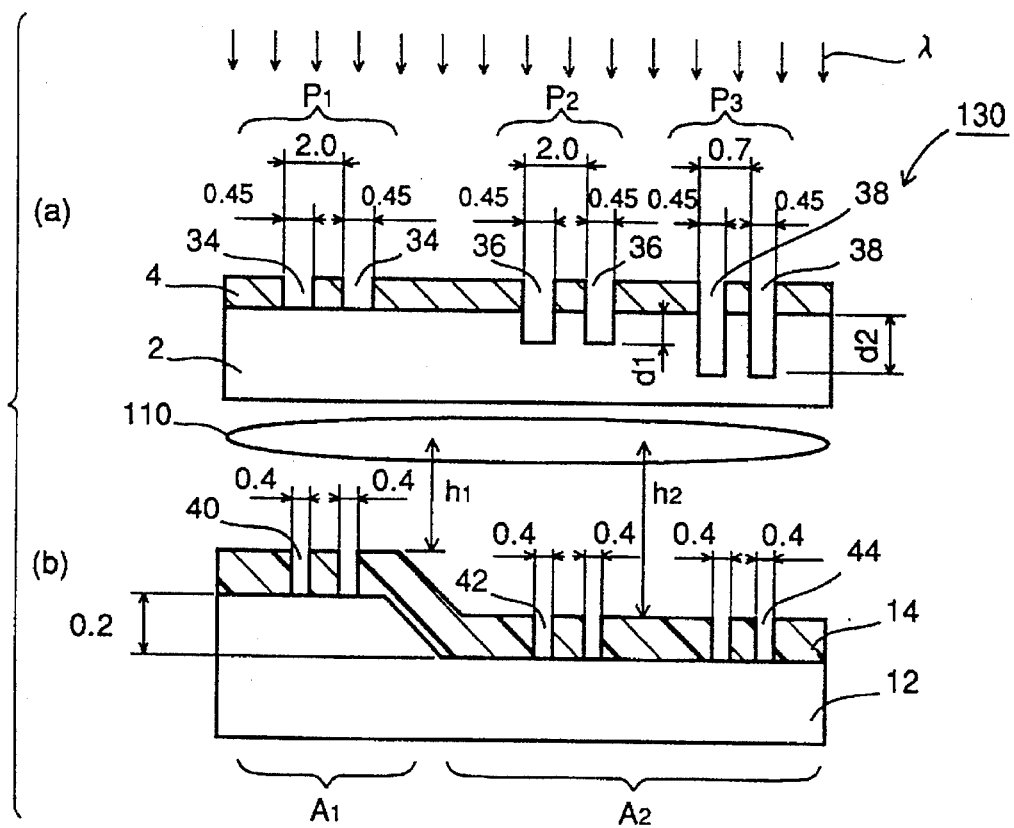
FIG. 7 shows a third embodiment of the present invention in which (a) is a cross section showing a structure of an attenuation type phase shift mask, and (b) is a cross section of a resist film formed by using the attenuation type phase shift mask of (a).

Referring to FIG. 7(a), cross sectional structure of the phase shift mask 130 of attenuation type used in the present embodiment will be described. On prescribed positions of quartz substrate 2, there are a first pattern $P_1$ in which first light transmitting portions 34 having hole diameter of 0.45 μm through which transparent quartz substrate 2 is exposed are arranged with a pitch of 2.0 μm; a second pattern $P_2$ in which second light transmitting portions 36 having hole diameter of 0.45 μm through which quartz substrate 2 is exposed are arranged at a pitch of 2.0 μm; and a third pattern $P_3$ in which third light transmitting portions 38 having hole diameter of 0.45 μm through which quartz substrate 2 is exposed are arranged at a pitch of 0.7 μm. Phase shift film 4 is formed of the same material as in the first and second embodiments, it provides a phase angle of 180° to the exposure light passing therethrough, and it has transmittance of 10%. At the second light transmitting portion 36, quartz substrate 2 is dug to the depth of $d_1$ so as to provide a phase angle of 10° to the exposure light transmitting therethrough, and at the third light transmitting portion 38, quartz substrate 2 is dug to the depth of $d_2$ so as to provide phase angle of 20° to the exposure light passing therethrough.

The resist film exposured/developed by using the attenuation type phase shift mask 130 will be described with reference to FIG. 7(b).

The resist film 14 is formed on a stepped substrate 12, and the step is reflected to the surface of resist film 14. Therefore, the distance from the left region $A_1$ of the resist film 14 to projection lens 101 is different from the distance from the right region $A_2$ to the projection lens 101 ($h_1$ and $h_2$ in the figure), with the step being the boundary.

At a position corresponding to the first pattern $P_1$ of resist film 14, holes 40 having the diameter of 0.4 μm are formed at a pitch of 2.0 μm, at the position corresponding to the second pattern $P_2$ of resist film 14, holes 42 having the diameter of 0.4 μm are formed at a pitch of 2.0 μm, and at the position corresponding to the third pattern $P_3$ of resist film 14, holes 44 having the diameter of 0.4 μm are formed at a pitch of 0.7 μm.

Figure 8:
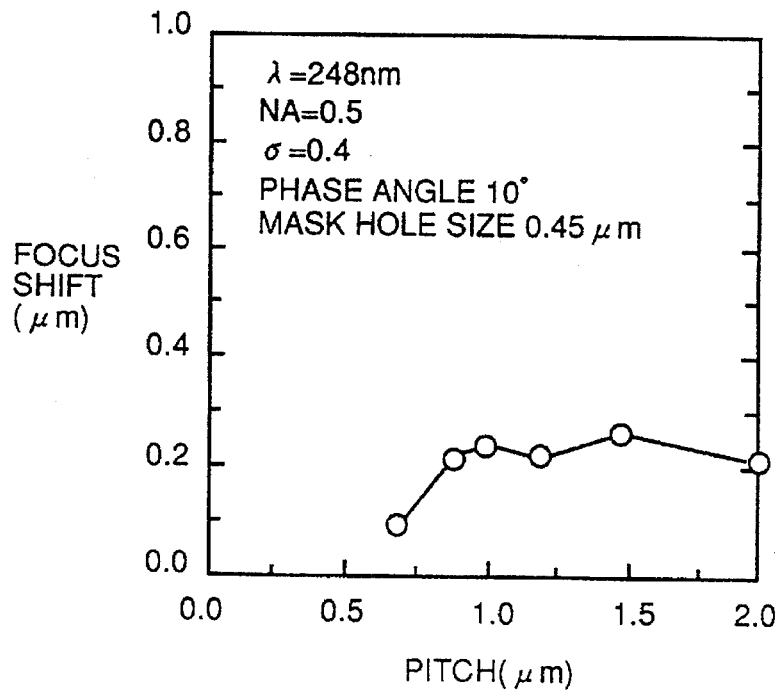
FIG. 8 shows relation between pitch of mask holes and focus shift.

Relation between the distance between the second and third light transmitting portions of the second and third patterns and focus shift with prescribed phase angle of the exposure light passing through the second and third patterns and prescribed hole diameters of the second and third patterns will be described with reference to FIG. 8. FIG. 8 shows the relation between the pitches of the mask holes and the focus shift when the wavelength of the exposure light is 248 nm, numerical aperture (NA) of the exposure apparatus is (NA)=0.5, coherency (σ) is (σ)=0.4, phase angle is 10° and the mask hole diameter is 0.45 μm. It can be seen from this figure that when the pitch of the mask holes is 2.0 μm, the focus shift is 0.2 μm. Therefore, if the step between the regions $A_1$ and $A_2$ is 0.2, the regions $A_1$ and $A_2$ can be exposed simultaneously through the same step of exposure with optimal focal positions.

If the pitch of the mask hole is 0.7, for example, it can be seen that the focus shift is 0.1 μm from FIG. 8. Therefore, as shown by the graph of FIG. 3 showing the relation between the phase angle and the focus shift, as the phase angle and the focus shift is in direct proportion as long as the phase angle is 0° to 20°, the focus shift can be set to 0.2 μm by setting the phase angle 20°, with the pitch of the mask hole being 0.7. Therefore, by using the attenuation type phase shift mask 130 shown in FIG. 7(a), every region of the resist film 14 having the step of 0.2 μm shown in FIG. 7(b) can be exposed at the optimal focal position.

Figure 9:
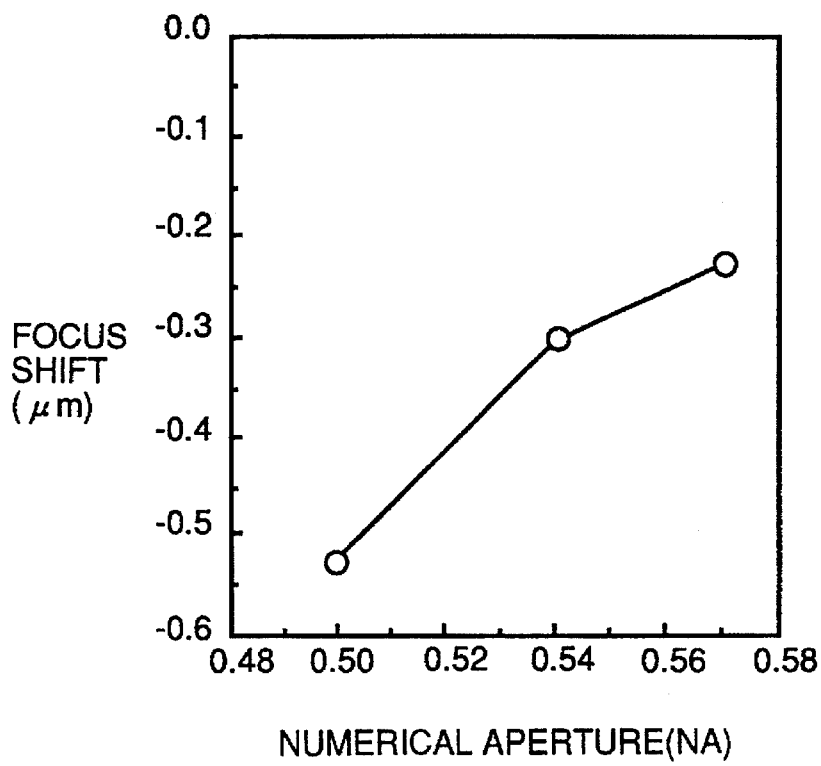
FIG. 9 shows relation between numerical aperture and focus shift.
Figure 10:
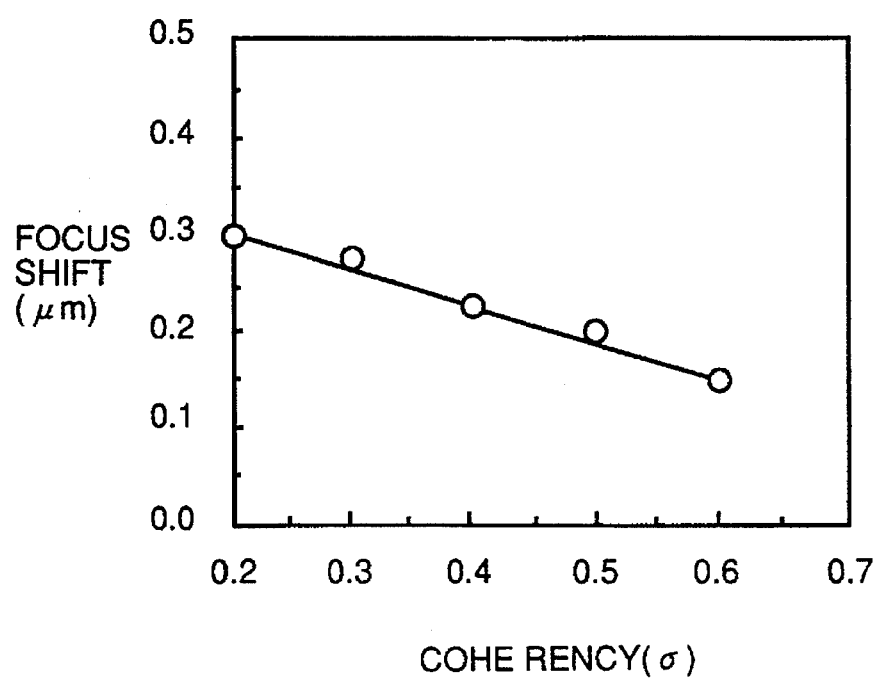
FIG. 10 shows relation between coherency ($\sigma$) and focus shift.
Figure 11:
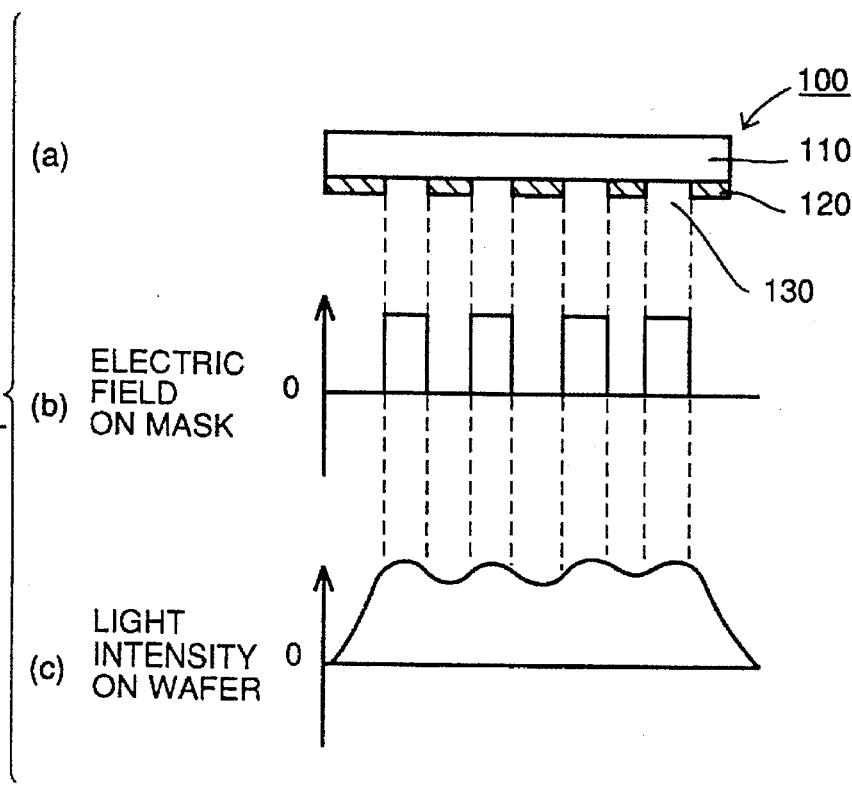
FIG. 11 shows a conventional photomask in which (a) is a cross section of the conventional photomask, (b) shows electric field of the exposure light on the photomask and (c) shows intensity of exposure light on a semiconductor wafer.
Figure 12:
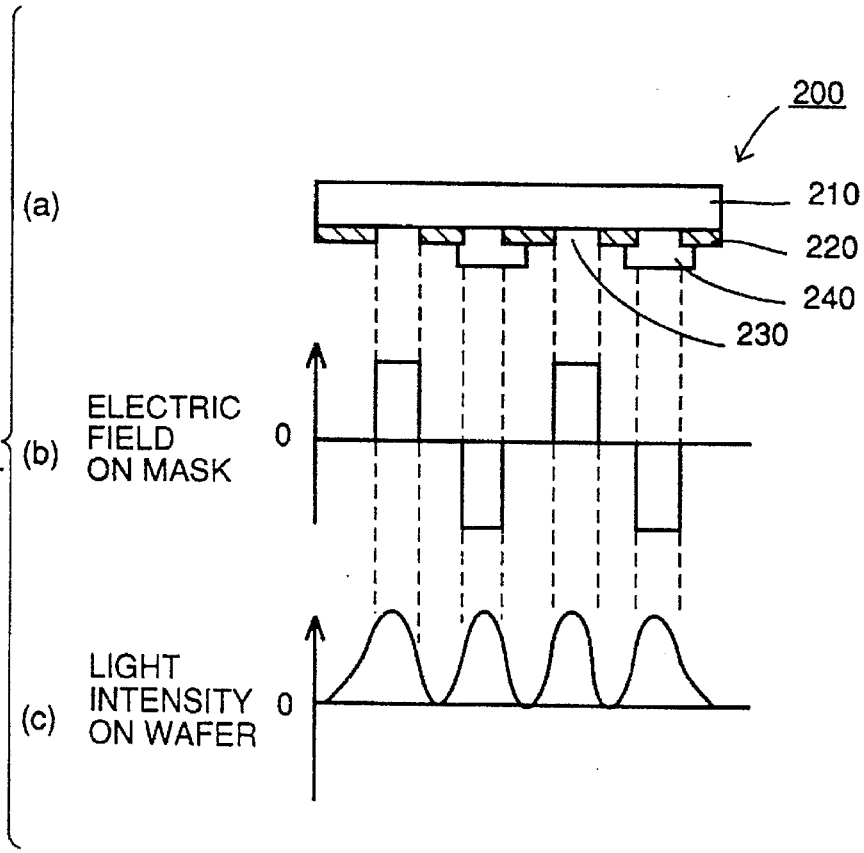
FIG. 12 shows a conventional phase shift mask in which (a) is a cross section showing a structure of a conventional phase shift mask, (b) shows electric field of exposure light on the photomask, and (c) shows intensity of exposure light on a semiconductor wafer.
Figure 13:
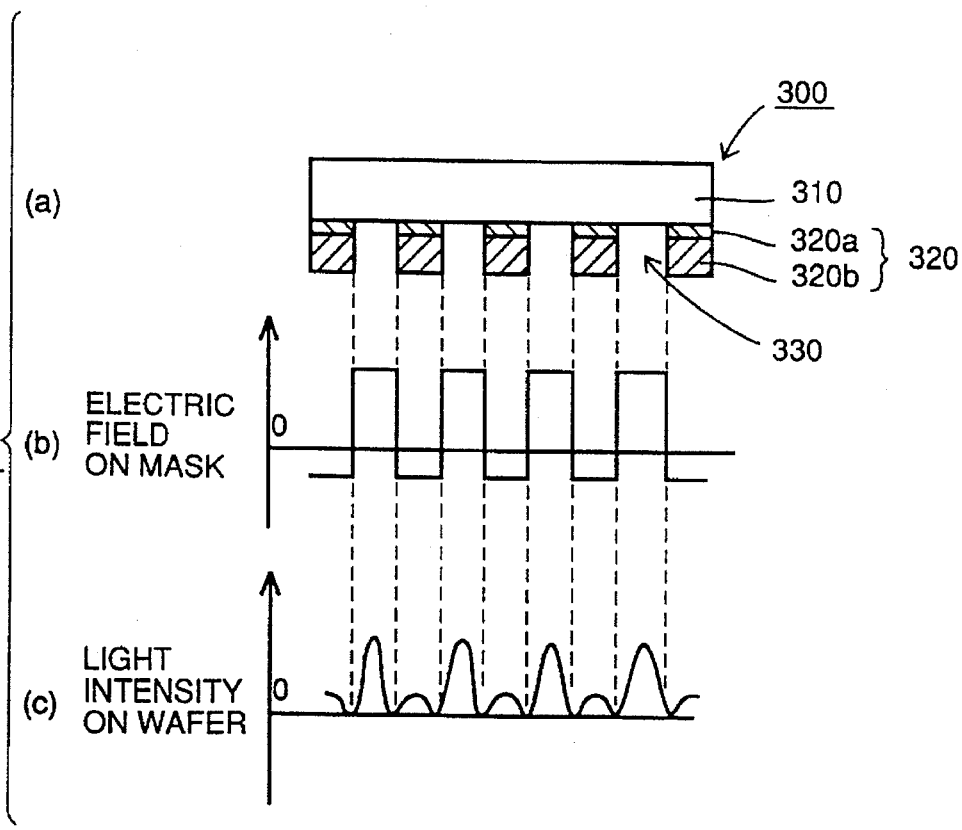
FIG. 13 shows an attenuation type phase shift mask in which (a) shows a structure of the attenuation type phase shift mask, (b) shows electric field of the exposure light on the photomask, and (c) shows intensity of exposure light on a semiconductor wafer.
Figure 14:
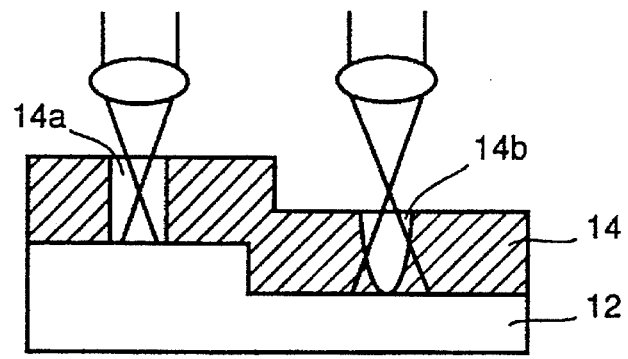
FIGS. 14 to 16 are first to third illustrations showing disadvantages of the method of exposure employing the attenuation type phase shift mask.
Figure 15:
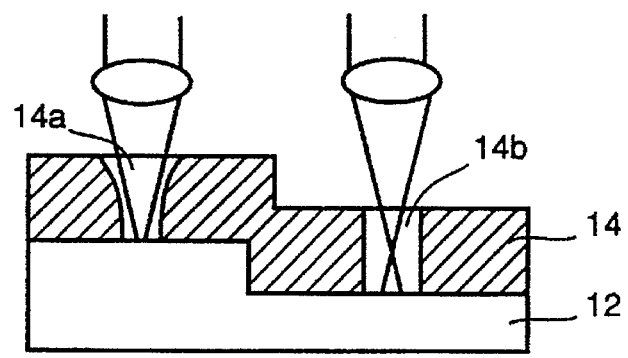
Figure 16:
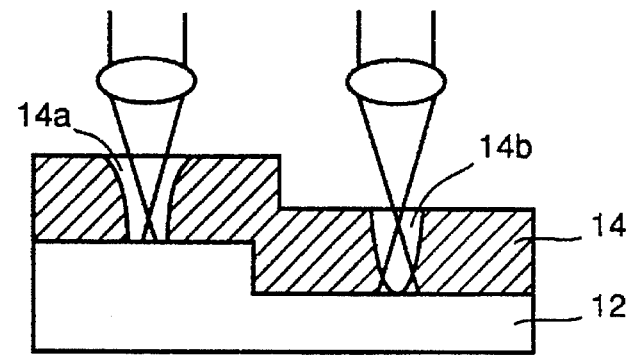

In the first, second and third embodiments above, the numerical aperture (NA) of the exposure apparatus and the coherency (σ) are fixed. However, there is such a relation as shown in FIG. 9 between the numerical aperture (NA) and the focus shift. Therefore, it should be noted that when the numerical aperture changes, the focus shift changes accordingly. Further, there is such a relation as shown in FIG. 10 between the value of coherency (σ) and the focus shift. Therefore, it should be noted that when coherency (σ) changes, the focus shift changes accordingly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of exposure using a phase shift mask of attenuation type, for exposing, using an exposure apparatus including an attenuation type phase shift mask having first and second light transmitting portions through which a transparent substrate is exposed, and a phase shift mask formed on said transparent substrate to surround said first and second light transmitting portions, a material having a first region to be exposed positioned at a first distance from a projection lens of said exposure apparatus corresponding to a region of said first light transmitting portion, and a second region to be exposed positioned at a second distance from the projection lens of said exposure apparatus corresponding to a region of said second light transmitting portion, comprising the steps of:

providing a prescribed phase angle to exposure light passing through said second light transmitting portion; and calculating optimal value of difference between said first and second distances, based on said phase angle and hole diameter of said second light transmitting portion.

2. A method of exposure using a phase shift mask of attenuation type for exposing, using an exposure apparatus including an attenuation type phase shift mask having first and second light transmitting portions through which a transparent substrate is exposed, and a phase shift film formed on said transparent substrate to surround said first and second light transmitting portions, a material having a first region to be exposed positioned at a first distance from a projection lens of said exposure apparatus corresponding to the region of said first light transmitting portion and a second region to be exposed positioned at a second distance from the projection lens of said exposure apparatus corresponding to a region of said second light transmitting portion, comprising the steps of:

providing a prescribed phase angle to exposure light passing through said second light transmitting portion; and calculating optimal value of difference between said first and second distances based on said phase angle, hole size of said second light transmitting portion and on transmittance of said phase shift mask in a periphery of said second light transmitting portion, with transmittance of said phase shift mask in a periphery of said second light transmitting portion made different from transmittance of said phase shift mask in a periphery of said first light transmitting portion.

3. A method of exposure using a phase shift mask of attenuation type, for exposing, by using an exposure apparatus including a phase shift mask formed on a transparent substrate, a first pattern including a plurality of first light transmitting portions arranged at a prescribed pitch through which said transparent substrate is exposed, and a second pattern in which a plurality of second light transmitting portions are arranged at a prescribed pitch through which said transparent substrate is exposed, a material having a first region to be exposed positioned at a first distance from a projection lens of said exposure apparatus corresponding to a region of said first pattern, and a second region to be exposed positioned at a second distance from the projection lens of said exposure apparatus corresponding to said second pattern, comprising the steps of:

Providing a prescribed phase angle to exposure light passing through said second light transmitting portion, and calculating optimal value of difference between said first and second distances, based on said phase angle, hole size of said second light transmitting portion and distance between said second light transmitting portions.

* * * * *